(12) United States Patent
Clark

(10) Patent No.: US 8,642,124 B2
(45) Date of Patent: Feb. 4, 2014

(54) GAS DISPERSION SHIELD METHOD

(75) Inventor: Randall Clark, Colchester, VT (US)

(73) Assignee: Pentagon Technologies Group, Inc., Hayward, CA (US)

( * ) Notice: Subject to any disclaimer, the term of this patent is extended or adjusted under 35 U.S.C. 154(b) by 123 days.

(21) Appl. No.: 12/717,828

(22) Filed: Mar. 4, 2010

(65) Prior Publication Data

US 2010/0159133 A1  Jun. 24, 2010

Related U.S. Application Data

(62) Division of application No. 11/633,696, filed on Dec. 4, 2006, now abandoned.

(60) Provisional application No. 60/758,982, filed on Jan. 13, 2006.

(51) Int. Cl.
*C23C 16/00* (2006.01)

(52) U.S. Cl.
USPC ...... 427/248.1; 427/569; 118/715; 118/723 R

(58) Field of Classification Search
USPC .................. 118/715, 723 R; 427/248.1, 569
See application file for complete search history.

(56) References Cited

U.S. PATENT DOCUMENTS

| | | | |
|---|---|---|---|
| 4,512,283 A | 4/1985 | Bonifield et al. | |
| 4,513,021 A | 4/1985 | Purdes et al. | |
| 5,449,410 A | 9/1995 | Chang et al. | |
| 5,746,875 A | 5/1998 | Maydan et al. | |
| 6,263,829 B1 * | 7/2001 | Schneider et al. | 118/723 I |
| 6,264,788 B1 | 7/2001 | Tomoyasu et al. | |
| 6,730,174 B2 * | 5/2004 | Liu et al. | 118/715 |
| 7,390,524 B1 * | 6/2008 | Chen | 427/2.24 |

* cited by examiner

*Primary Examiner* — Elizabeth Burkhart
(74) *Attorney, Agent, or Firm* — DLA Piper LLP (US)

(57) ABSTRACT

A gas dispersion shield and method for protecting the bottom surface of a gas deposition chamber, while injecting gas from a gas insertion channel into the chamber at a non-vertical angle. The gas dispersion shield includes a cylindrically shaped vertical sidewall, an annular flange extending horizontally and outwardly from the sidewall upper end, and a horizontal wall that extends inwardly from the sidewall lower end. The flange includes a top surface, a bottom surface, and a plurality of holes formed through the flange each extending in a non-vertical direction from the bottom surface to the top surface. The bottom surface includes an annular protrusion that fits at least partially into the gas insertion channel, to ensure the gas flows through the non-vertical holes instead of escaping around the flange.

9 Claims, 3 Drawing Sheets

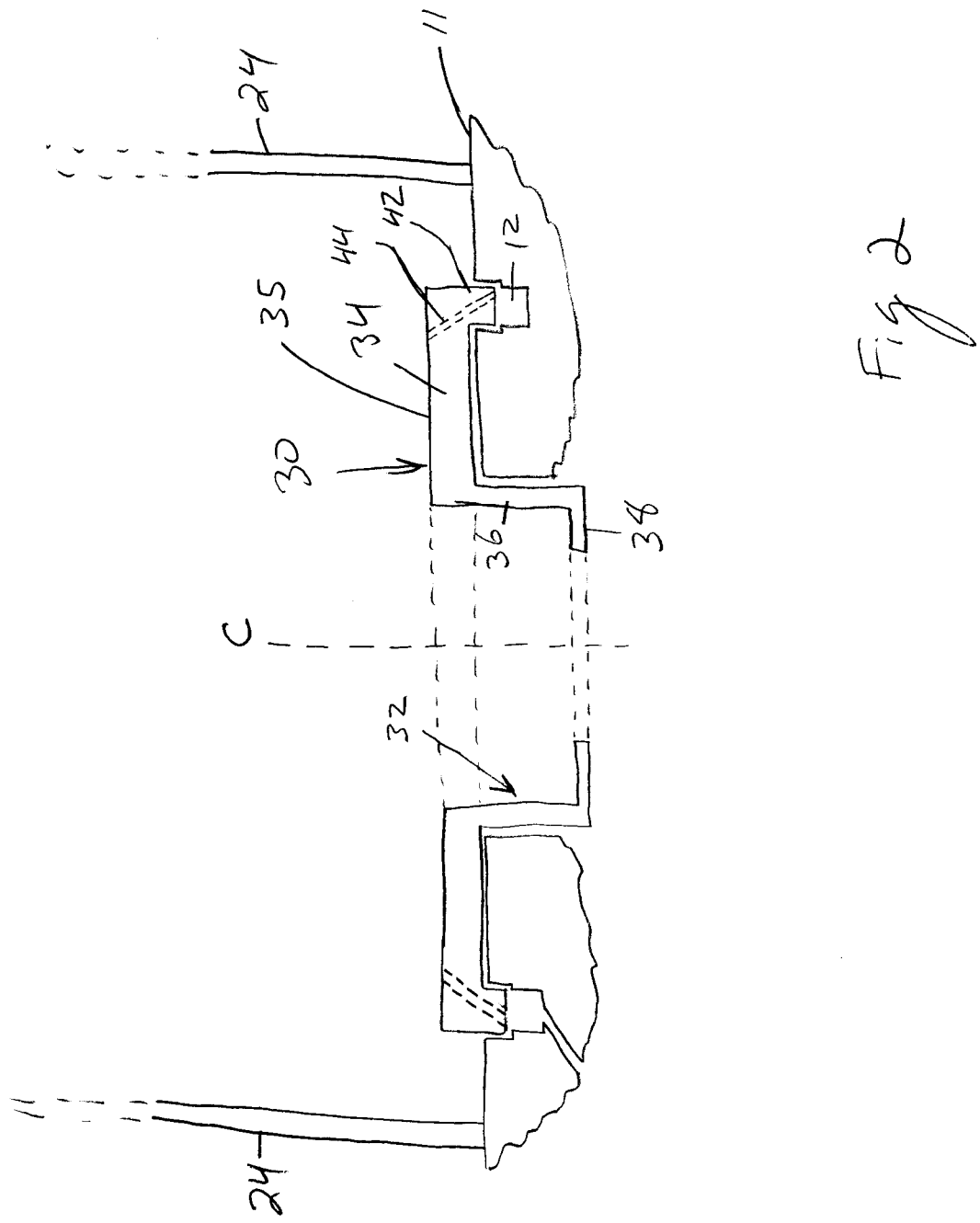

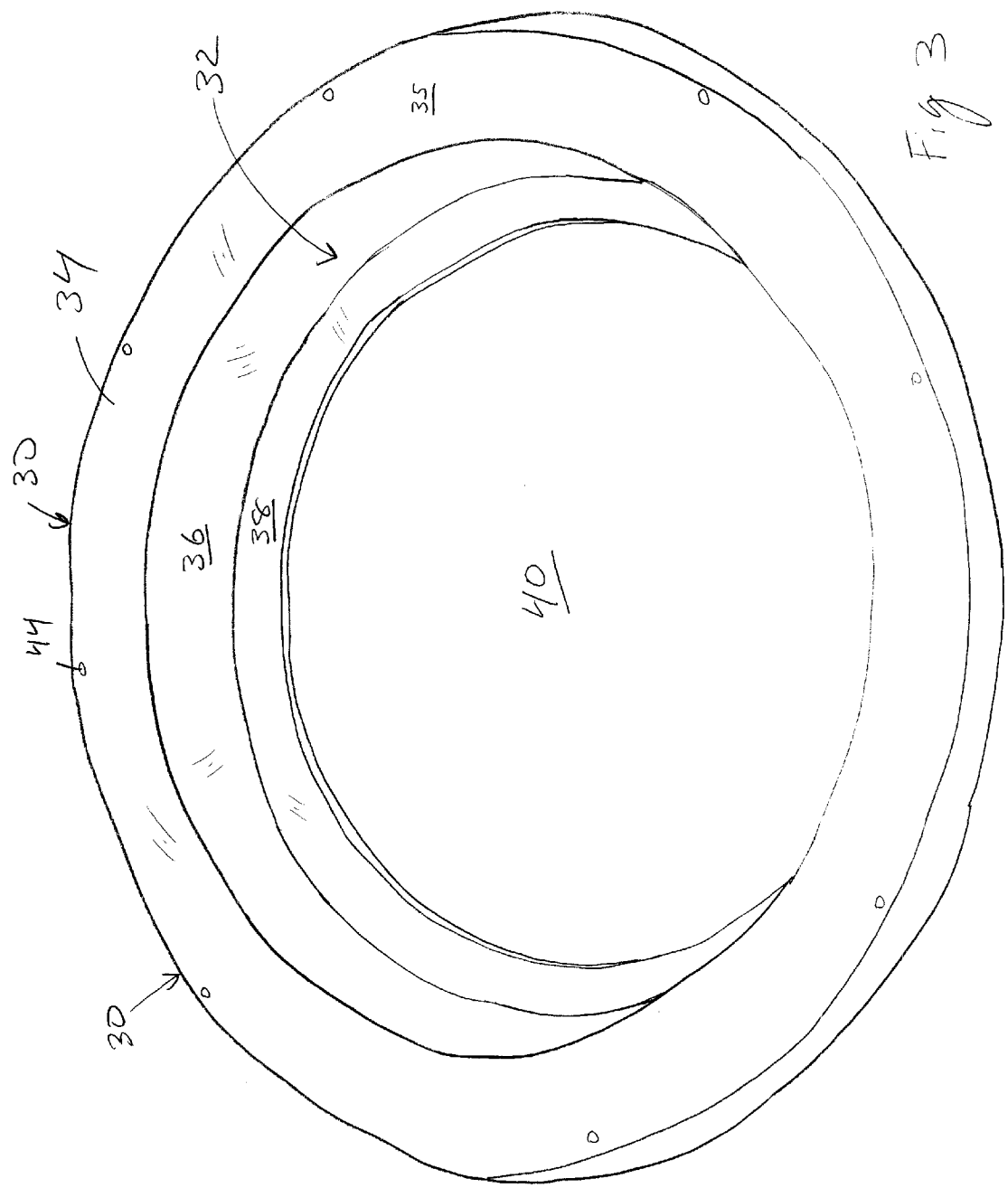

GAS DISPERSION SHIELD METHOD

This application is a divisional of U.S. patent application Ser. No. 11/633,696, filed Dec. 4, 2006, now abandoned, which claims the benefit of U.S. Provisional Application No. 60/758,982, filed Jan. 13, 2006, which is incorporated herein by reference.

FIELD OF THE INVENTION

The present invention relates to gas deposition chambers, and in particular to protective shields for such deposition chambers that protect the chamber as well as disperse gases into the chamber.

BACKGROUND OF THE INVENTION

A typical gas dispersion configuration for gas deposition chambers (e.g. plasma enhanced deposition chambers, epitaxial reactors, etch chambers, etc.) is illustrated in FIG. 1. Such chambers include a gas inlet 10 at the bottom 11 of chamber, for injection of gas into the chamber. The gas inlet feeds the gas into an annular gas insertion channel 12 that goes around the entire circumference of the chamber bottom wall 11 (for even distribution into the chamber). In order to protect the stepped shaped bottom wall 11 of the chamber, a protective shield 14 is secured onto the bottom wall 11 of the chamber using screws 16. In order to ensure even distribution of the gas, a gas dispersion ring 18 is secured onto the bottom of the chamber using screws 20. The ring covers the annular channel 12, and includes evenly spaced holes 22 extending vertically through the ring 18 and directly over the channel 12, so that gas is evenly and vertically injected into the chamber. After one or more gas deposition processes (which are well known in the art and not further disclosed herein), the protective shield 14 and gas dispersion ring 18 are removed and replaced so subsequent processes are not contaminated.

One problem with the prior art configuration is that it is time consuming to remove and replace the shield 14 and ring 18 after each process, because it takes time to remove and replace all the screws 16/20 used to hold down these parts, and there are two separate parts to remove and replace. Further, the screws 16/20 provide a source of contamination. Finally, the gas exiting the channel 12 is injected vertically upwards from annular gas dispersion ring holes 22, which are already disposed at or near the chamber side walls 24. Such gas injection impinges on the chamber walls 24 causing poor adhesion of deposited etchant (causing particle problems).

There is a need for an improved protective shield and gas dispersion ring configuration that provides more convenient installation and removal, and improved gas injection characteristics.

SUMMARY OF THE INVENTION

The present invention solves the aforementioned problems by providing a gas dispersion shield and method that both protects the chamber bottom surface and better injects gas into the chamber.

The method of protecting a stepped shaped bottom surface of a gas deposition chamber having an annular shaped gas insertion channel, includes 1) placing a gas dispersion shield on a stepped shaped bottom surface of a gas deposition chamber, wherein the gas dispersion shield includes a cylindrically shaped vertical sidewall having upper and lower ends, and an annular flange extending horizontally and outwardly from the sidewall upper end and having top and bottom flange surfaces and a plurality of holes formed therein extending in a non-vertical direction from the bottom flange surface to the top flange surface, with openings of the holes in the bottom flange surface being disposed over a gas insertion channel of the gas deposition chamber bottom surface, 2) injecting a gas into the gas insertion channel such that the gas flows through the plurality of holes and is injected into the gas deposition chamber in a non-vertical direction, and 3) removing the gas dispersion shield from the gas deposition chamber bottom surface.

Other objects and features of the present invention will become apparent by a review of the specification, claims and appended figures.

BRIEF DESCRIPTION OF THE DRAWINGS

FIG. 2 is a cross sectional view of the gas dispersion shield of the present invention, mounted onto the bottom wall of a gas dispersion chamber.

FIG. 3 is a perspective view of the gas dispersion shield of the present invention.

DETAILED DESCRIPTION OF THE PREFERRED EMBODIMENTS

Figure 1:
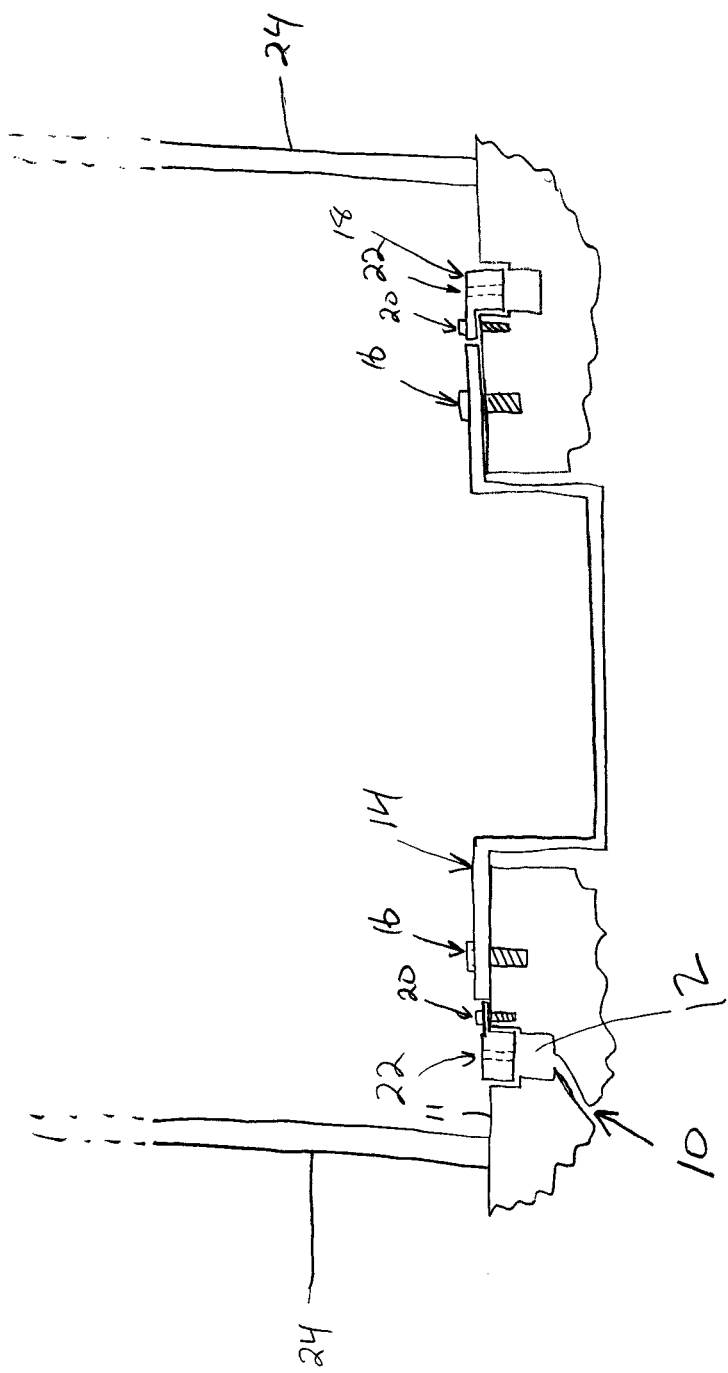
FIG. 1 is a cross sectional view of the prior art protective shield and gas dispersion ring, both screwed down onto the bottom wall of a gas dispersion chamber.

The present invention is a gas dispersion shield and method that combines the functionality of the prior art protective shield and gas dispersion ring, and better directs the injected gas away from the chamber walls to drastically improve particle performance.

The gas dispersion shield 30 of the present invention is shown in FIGS. 2-3, and includes a cup-shaped main portion 32 that inserts onto and protects the stepped shaped bottom wall 11 of the chamber, and a flange 34 extending laterally from the upper end of the cup-shaped main portion 32 and extends over and covers the gas insertion channel 12. The main portion 32 includes a downwardly depending (cylindrically shaped) wall 36 and an optional inwardly extending horizontal wall or flange 38 at the lower end thereof that is either solid or can have an aperture 40 therein as shown in FIGS. 2-3.

Flange 34 includes a horizontal wall 35 that extends outwardly from the upper end of wall 36 and covers gas insertion channel 12 when placed on the gas dispersion chamber bottom wall 11. Flange 34 preferably includes a downwardly extending annular protrusion 42 that inserts at least partially into the reactor's gas insertion channel 12 (to help prevent gas leakage between the flange and the chamber bottom wall). A plurality of gas injection holes 44 are formed through the flange 34 (between its top and bottom surfaces) each extending in a non-vertical direction, preferably both upwardly and toward a center axis C of the cylindrically shaped side wall 36 (which in most cases will coincide with the center of the chamber. For example, holes 44 can extend between 25 and 65 degrees relative to vertical, most preferably around 30 degrees). The openings of holes 44 in the flange bottom surface are located over the reactor's gas insertion channel 12 when the gas dispersion shield 30 is placed on the chamber bottom wall 11, so that gas from the channel 12 is injected by the holes 44 upwardly and toward the center of the chamber (i.e. away from the chamber side walls 24).

Because the main portion 32 is integrally formed together with the gas dispersion flange 34, screws are not needed to hold gas dispersion shield 30 in place, because the weight of the metal material thereof (e.g. aluminum, stainless steel, etc.) keeps the dispersion shield 30 in place. Additionally, a friction fit can also be formed between the stepped bottom wall 11 of the chamber and wall 36, and/or between channel 12 and protrusion 42. Thus, the time needed to swap/replace the gas dispersion shield 30 between gas deposition processes is reduced. Moreover, the non-vertical gas injection holes provide better gas distribution and particle performance which is essential for optimum tool performance, and which reduces particle levels in the chamber.

It is to be understood that the present invention is not limited to the embodiment described above and illustrated herein, but encompasses any and all variations falling within the scope of the appended claims.

What is claimed is:

1. A method of protecting a stepped shaped bottom surface of a gas deposition chamber having an annular shaped gas insertion channel, the method comprising:

placing an integrally formed gas dispersion shield on a stepped shaped bottom surface of a gas deposition chamber, wherein the gas dispersion shield includes a cylindrically shaped vertical sidewall having upper and lower ends, and an annular flange extending horizontally and outwardly from the sidewall upper end and having top and bottom flange surfaces and a plurality of holes formed therein extending in a non-vertical direction from the bottom flange surface to the top flange surface, with openings of the holes in the bottom flange surface being disposed over a gas insertion channel of the gas deposition chamber bottom surface, and wherein the placing of the gas dispersion shield includes forming a friction fit between the vertical sidewall and the gas deposition chamber bottom surface;

injecting a gas into the gas insertion channel such that the gas flows through the plurality of holes and is injected into the gas deposition chamber in a non-vertical direction; and removing the gas dispersion shield from the gas deposition chamber bottom surface.

2. The method of claim 1, wherein the placing of the gas dispersion shield includes forming the friction fit between the vertical sidewall and the gas deposition chamber bottom surface without the use of screws.

3. The method of claim 1, wherein the gas dispersion shield further comprises a horizontal wall that extends inwardly from the sidewall lower end and is disposed over the gas deposition chamber bottom surface after the placing of the gas dispersion shield.

4. The method of claim 3, wherein the horizontal wall includes an aperture formed therein.

5. The method of claim 1, wherein the flange bottom surface includes a downwardly extending annular protrusion, and wherein the placing of the gas dispersion shield further comprises at least partially inserting the downwardly extending annular protrusion into the gas insertion channel.

6. The method of claim 5, wherein the plurality of holes extend through the downwardly extending annular protrusion.

7. The method of claim 1, wherein the holes extend in a direction between 25 and 65 degrees relative to the vertical sidewall.

8. The method of claim 1, wherein the holes extend in a direction generally about 30 degrees relative to the vertical sidewall.

9. The method of claim 1, wherein each of the holes extends upwardly and toward a center axis of the cylindrically shaped vertical side wall.

* * * * *